United States Patent
Chang et al.

(10) Patent No.: US 11,031,383 B2
(45) Date of Patent: Jun. 8, 2021

(54) SEMICONDUCTOR DEVICE

(71) Applicant: TAIWAN SEMICONDUCTOR MANUFACTURING CO., LTD., Hsinchu (TW)

(72) Inventors: Jacklyn Chang, San Ramon, CA (US); Derek C. Tao, Fremont, CA (US); Kuo-Yuan Hsu, San Jose, CA (US)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 129 days.

(21) Appl. No.: 16/103,739

(22) Filed: Aug. 14, 2018

(65) Prior Publication Data
US 2020/0058634 A1    Feb. 20, 2020

(51) Int. Cl.
*H01L 27/02*      (2006.01)
*H01L 29/78*      (2006.01)
*H01L 29/66*      (2006.01)
*H01L 27/105*     (2006.01)

(52) U.S. Cl.
CPC ...... *H01L 27/0207* (2013.01); *H01L 27/1052* (2013.01); *H01L 29/66795* (2013.01); *H01L 29/785* (2013.01); *H01L 2029/7858* (2013.01)

(58) Field of Classification Search
None
See application file for complete search history.

(56) References Cited

U.S. PATENT DOCUMENTS

| | | | |
|---|---|---|---|
| 9,105,490 B2 | 8/2015 | Wang et al. | |
| 9,236,267 B2 | 1/2016 | De et al. | |
| 9,236,300 B2 | 1/2016 | Liaw | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,831,183 B2 | 11/2017 | Lin et al. | |
| 9,859,386 B2 | 1/2018 | Ho et al. | |
| 2017/0221905 A1* | 8/2017 | Chen | H01L 28/00 |

* cited by examiner

*Primary Examiner* — Moazzam Hossain
*Assistant Examiner* — Stanetta D Isaac
(74) *Attorney, Agent, or Firm* — Maschoff Brennan

(57) ABSTRACT

A memory device is disclosed that includes memory cell, e strap cell, conductive segment, and logic cell. The strap cell is arranged abutting the memory cell. The strap cell includes an active region, a first gate, and a second gate. The first gate is arranged across the active region. The second gate is arranged across the active region and disposed at the end of active region. The conductive segment is disposed over the first gate and the second gate. The strap cell is disposed between the memory cell and the logic cell, and the logic cell includes a third gate. The conductive segment is spaced apart from the third gate, and the length of the conductive segment is smaller than five times of a gate pitch between the first gate and the second gate.

20 Claims, 9 Drawing Sheets

SEMICONDUCTOR DEVICE

BACKGROUND

Layouts of circuit elements in integrated circuits (ICs) may affect performance and die areas of the ICs. For instance, a non-optimized layout may result in a circuit having unnecessary circuitry and/or unnecessary loads. The unnecessary circuitry may further increase the die area of the entire circuit. In addition, the unnecessary loads degrade the speed of the entire circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
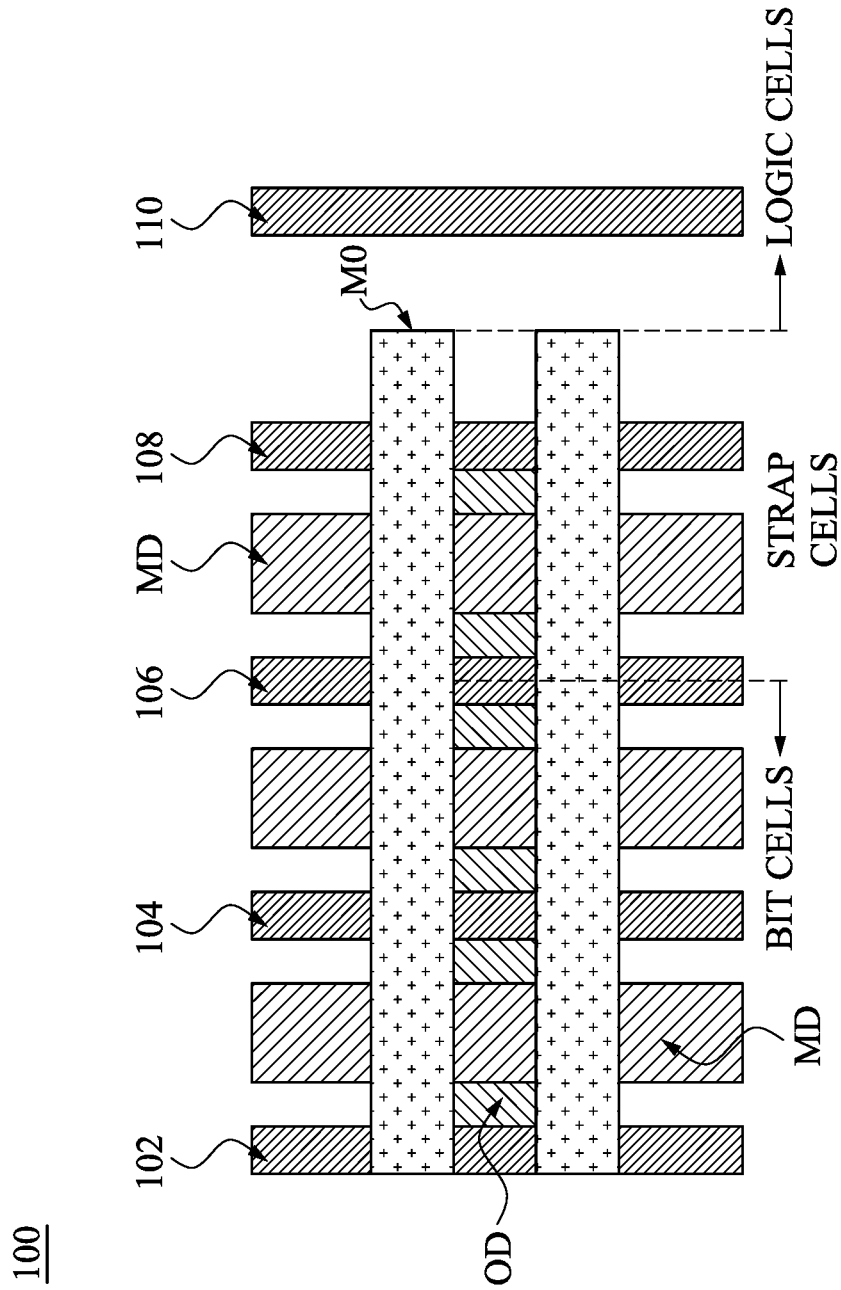
FIG. 1 is a schematic diagram of a layout structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Reference is made to FIG. 1. FIG. 1 is a schematic diagram of a layout structure 100 according to some embodiments of the present disclosure. In some embodiments, the layout structure 100 shown in FIG. 1 includes bit cells, strap cells, and logic cells. The strap cells are disposed between the bit cells and the logic cells. For illustration of FIG. 1, the strap cells abut the bit cells, and the logic cells are arranged next to the strap cells and abut the strap cells. In various embodiments, the strap cells immediately abut the bit cells and the logic cells, without other elements and/or cells therebetween. For simplicity of illustration, FIG. 1 only shows a portion of the layout structure 100. Other elements of the layout structure 100 are within the contemplated scope of the present disclosure.

In some embodiments, the bit cells are also referred to as memory cells for storing data, and the memory cells are used in memory devices including, for example, read-only memory (ROM). In some embodiments, one or more of the bit cells includes 6 transistors (not shown), in which four of the transistors are cross coupled, and the other two transistors are controlled by a word line (not shown) and are coupled to a pair of bit lines (not shown). The usage of the bit cells described above is given for the explanation purposes. Various usages of the bit cells are within the contemplated scope of the present disclosure.

In some embodiments, the bit cells include at least one active region which is designated as OD, and a number of gates including, for illustration, gates 102 and 104, as shown in FIG. 1. The gates 102 and 104 are disposed across the active region OD. In some embodiments, the gates 102 and 104 are polysilicon gates. In some embodiments, the active region OD is made of p-type doped material. In some other embodiments, the active region OD is made of n-type doped material. In some embodiments, the active region OD is configured for forming channels of transistors. In alternative embodiments, to form fin field-effect transistors (FinFETs), the active region OD is configured for forming fin structures. For simplicity of illustration, only gates 102 and 104 are illustrated in the bit cells. Various numbers of gates in the bit cells are within the contemplated scope of the present disclosure.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

In some embodiments, the bit cells include connection structures MD, as shown in FIG. 1. The connection structures MD are coupled to the active region OD and disposed crossing the active region OD. For illustration of FIG. 1, the connection structures MD are disposed between the gates 102 and 104 and coupled to the active region OD. The connection structures MD are separate from the gates 102 and 104. In some embodiments, in FinFETs, the connection structures MD are also referred to as fin connection structures or fin connection layer.

In some embodiments, the bit cells further include local connection structures M0. The local connection structures M0 are disposed above the active region OD and the gates 102 and 104. For illustration of FIG. 1, the local connection structures M0 are arranged perpendicular to the gates 102 and 104 in a plain view. In some embodiments, the local connection structures M0 are also referred to as local connection layer. In some embodiments, the local connection structures M0 are configured to be or to form bit lines in the memory device.

In some embodiments, the bit cells further include conductive structures M1 (not shown). The conductive structures M1 are despised above the local connection structures M0. For illustration of FIG. 1, the conductive structures M1 are arranged above the local connection structures M0 and disposed perpendicular to the local connection structures M0 in a plain view. The conductive structures M1 are coupled to the local connection structures M0. In some embodiments, the conductive structures M1 are made of metal and are also referred to as first metal layer.

In some embodiments, the strap cells include at least one active region which is also designated as OD, a first gate 106, and a second gate 108. For illustration of FIG. 1 with reference to FIG. 2A, the active region OD is disposed between the first gate 106 and the second gate 108. In some embodiments, the first gate 106 and the second gate 108 are made of the same material of the gates 102 and 104 of the bit cells. The active region OD is made of the same material of the active region OD of the bit cells. In some embodiments, the active region OD is continuously formed and used for forming the strap cells and the bit cells. For further illustration of FIG. 1 with reference to FIG. 2A, the second gate 108 of the strap cells is disposed at an end of the active region OD. For illustration of FIG. 1 with reference to FIG. 2A, a distance D1 between the first gate 106 and the second gate 108, or a distance D2 between the second gate 108 and the third gate 110, is referred to as a gate pitch. In some embodiments, the gate pitch is approximately 57.5 nanometers (nm). The length of the gate pitch is given for illustrative purposes. Various gate pitches are within the contemplated scope of the present disclosure.

In some embodiments, the strap cells include a connection structure MD. For illustration of FIG. 1 with reference to FIG. 2B, the connection structure MD is coupled to the active region OD and disposed crossing the active region OD. For illustration of FIG. 1, the connection structure MD is disposed between the first gate 106 and the second gate 108, and coupled to the active region OD. The connection structures MD is separate from the first gate 106 and the second gate 108. In some embodiments, the connection structure MD of the strap cells is made of the same material as the connection structure MD in the bit cells. In some embodiments, in FinFET, the connection structure MD of the strap cells is also referred to as fin connection structures or fin connection layer.

In some embodiments, the strap cells further include local connection structures M0. The local connection structures M0 are disposed above the active region OD, the first gate 106, and the second gate 108. For illustration of FIG. 1, the local connection structures M0 are arranged perpendicular to the gates 106 and 108 in a plain view. In some embodiments, the local connection structures M0 of the strap cells are made of the same material as the local connection structures M0 of the bit cells. In some embodiments, the local connection structures M0 are continuously formed and used for forming the strap cells and the bit cells.

In some embodiments, a width of the strap cells is defined from the center of the first gate 106, e.g., a dash line on the first gate 106 shown in FIG. 1, to an edge of the local connection structures M0, e.g., another dash line on the right edge of M0 shown in FIG. 1. In some embodiments, the width of the strap cells is larger than the gate pitch. In some embodiments, the width of the strap cells as illustrated in FIG. 1 is 1.5 times of the gate pitch between the first gate 106 and the second gate 108. In some other embodiments, the width of the strap cells as illustrated in FIG. 1 is approximately 85 nm. The width of the strap cells is given for illustrative purposes. Various widths of the strap cells are within the contemplated scope of the present disclosure. For example, the width of the strap cells is larger than 1.5 times of the gate pitch between the first gate 106 and the second gate 108, or the width of the strap cells is smaller than 5 times of the gate pitch between the first gate 106 and the second gate 108.

Figure 2A:
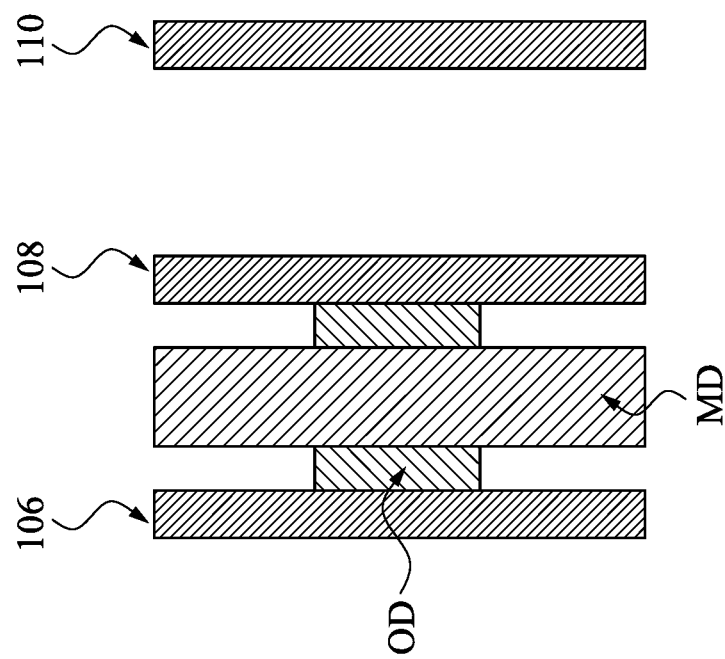
FIGS. 2A-2D are each a stage of forming the layout structure of FIG. 1, in accordance with various embodiments of the present disclosure.
Figure 2B:
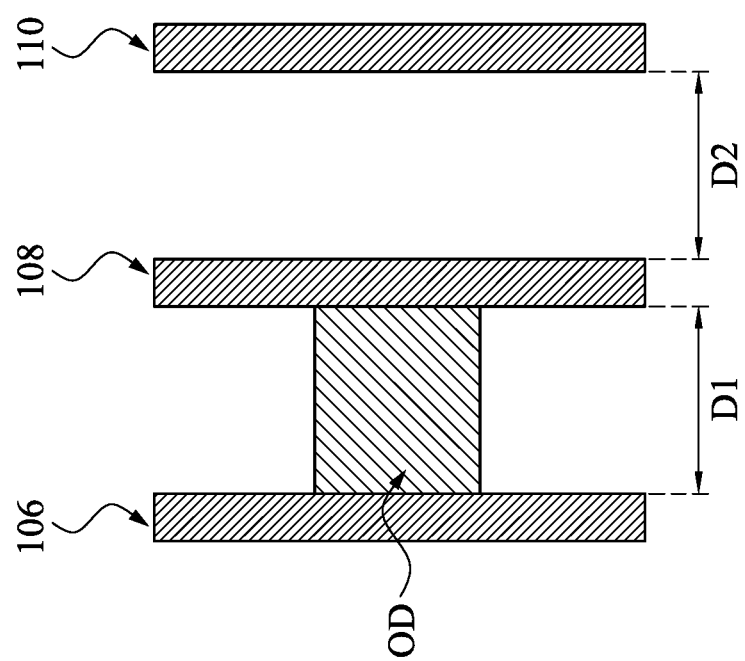
Figure 2D:
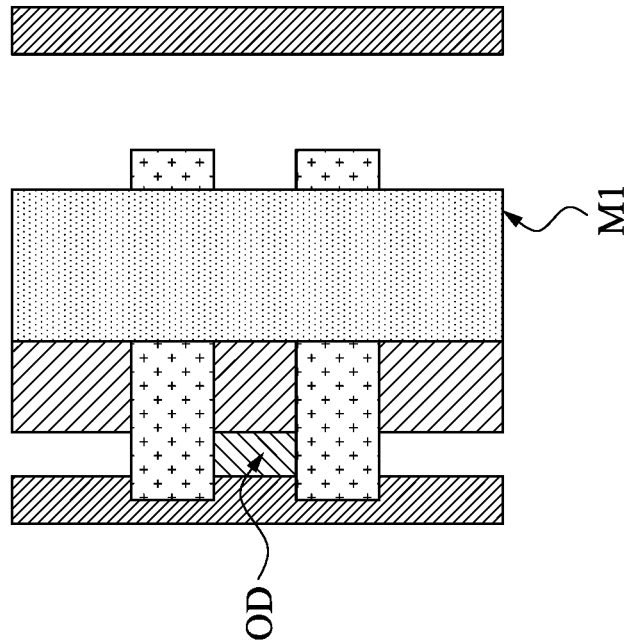

In some embodiments, the strap cells further include a conductive structure M1, as shown in FIG. 2D. The conductive structure M1 is disposed above the local connection structures M0. For illustration of FIG. 1 with reference to FIG. 2D, the conductive structure M1 is arranged above the local connection structures M0 and disposed perpendicular to the local connection structures M0 in a plain view. The conductive structure M1 also overlaps above the second gate 108. The conductive structure M1 is coupled to the local connection structures M0. In some embodiments, the conductive structure M1 of the strap cells is made of the same material as the conductive structures M1 of the bit cells.

In some embodiments, the active region OD disposed in the bit cells and the active region OD disposed in the strap cells, as discussed above with reference to FIG. 1, are continuous structures. Alternatively stated, the gates 102 and 104 of the bit cells, the first gate 106 of the strap cells, and the second gate 108 of the strap cells are arranged across the same active region OD. In such embodiments, the corresponding active region OD in the bit cells and the strap cells is made of the same material and has substantially the same properties including, for example, the same type dopant and the same doping concentration. Therefore, to form FinFET, the corresponding fins in the bit cells and the strap cells are made of the same material and have substantially the same properties.

In some embodiments, the local connection structures M0 disposed in the bit cells and the local connection structures M0 disposed in the strap cells, as discussed above with reference to FIG. 1, are continuous structures. In such embodiments, the corresponding local connection structures M0 in the bit cells and the strap cells are made of the same material and have substantially the same properties.

In some embodiments, the bit cells and the strap cells are continuous structure. In alternative embodiments, the strap cells are configured to be un-functional cells and are arranged at an edge of the bit cells. In some embodiments, one or more of the strap cells includes transistors arranged along the bit cells, in which the transistors are kept disable when the bit cells are in some operations.

In some embodiments, the logic cells include a third gate 110. The third gate 110 is disposed parallel to and spaced a distance apart from the second gate 108 of the strap cells. For illustration of FIG. 1, the third gate 110 is separated from the local connection structures M0 of the strap cells. The third gate 110 of the logic cells is spaced the gate pitch apart from the second gate 108 of the strap cells. The distance between the second gate 108 of the strap cells and the third gate 110 of the logic cells is given for illustrative purposes. Various distances between the second gate 108 of the strap cells and the third gate 110 of the logic cells are within the contemplated scope of the present disclosure. For example, the distance between the second gate 108 of the strap cells and the third gate 110 of the logic cells is 4 times of the gate pitch between the first gate 106 and the second gate 108 of the strap cells.

In some embodiments, the logic cells include, for example, AND gate, OR gate, NAND gate, NOR gate, and/or XOR gate, etc., which are coupled to the bit cells and are configured to process signals transmitted from the bit cells.

In some embodiments, the gates 102 and 104 in the bit cells, the first gate 106 and the second gate 108 in the strap cells, and the third gate 110 in the logic cells have the identical physical properties including, for example, the physical dimension and/or chemical composition. In some embodiments, those gates are formed in the same manufacturing process. In some other embodiments, those gates are formed independently in different manufacturing processes.

The above configuration of the layout structure 100 is given for illustrative purposes. Various configurations of the layout structure 100 are within the contemplated scope of the present disclosure. For example, in various embodiments, the layout structure 100 further includes other bit cells and strap cells disposed in the other side of the logic cells.

Reference is made to FIGS. 2A-2D. FIGS. 2A-2D are each a stage of forming the layout structure 100 of FIG. 1, in accordance with various embodiments of the present disclosure. With respect to the embodiments of FIG. 1, like elements in FIGS. 2A-2D are designated with the same reference for ease of understanding, and some elements in FIG. 1 are omitted in FIGS. 2A-2D for simplicity of illustration (for example, the bit cells are not shown in FIGS. 2A-2D). FIGS. 2A-2D are discussed with reference to FIGS. 3A-3D and FIG. 4 below for ease of understanding.

Reference is made to FIGS. 3A-3D. FIGS. 3A-3D are each a three dimensional view of a stage of forming the layout structure 100 of FIG. 1, in accordance with various embodiments of the present disclosure. With respect to the embodiments of FIG. 1, like elements in FIGS. 3A-3D are designated with the same reference for ease of understanding, and some elements in FIG. 1 are omitted in FIGS. 3A-3D for simplicity of illustration (for example, the bit cells are not shown in FIGS. 3A-3D). FIGS. 3A-3D are discussed with reference to FIGS. 2A-2D and FIG. 4 below for ease of understanding.

Figure 3A:
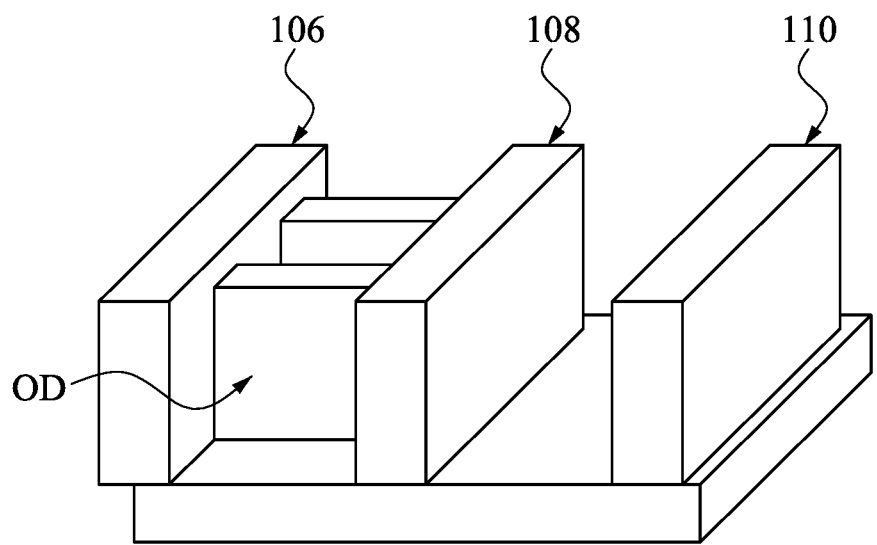
FIGS. 3A-3D are each a three dimensional view of a stage of forming the layout structure of FIG. 1, in accordance with various embodiments of the present disclosure.
Figure 3B:
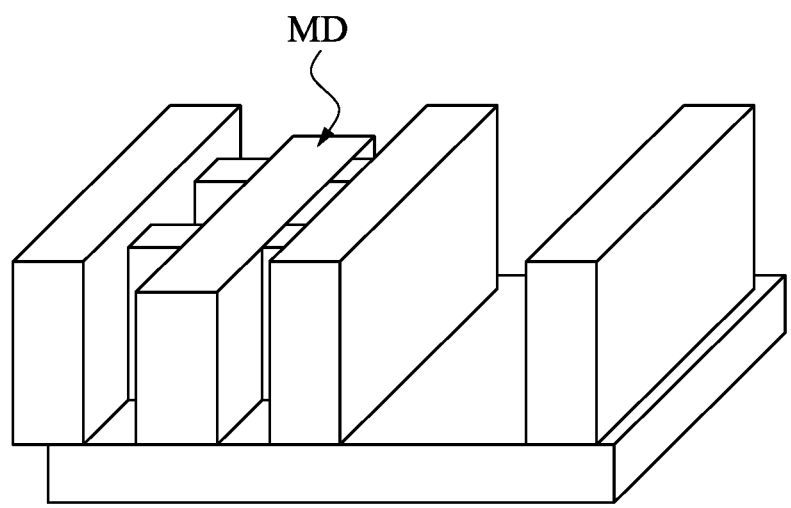
Figure 3C:
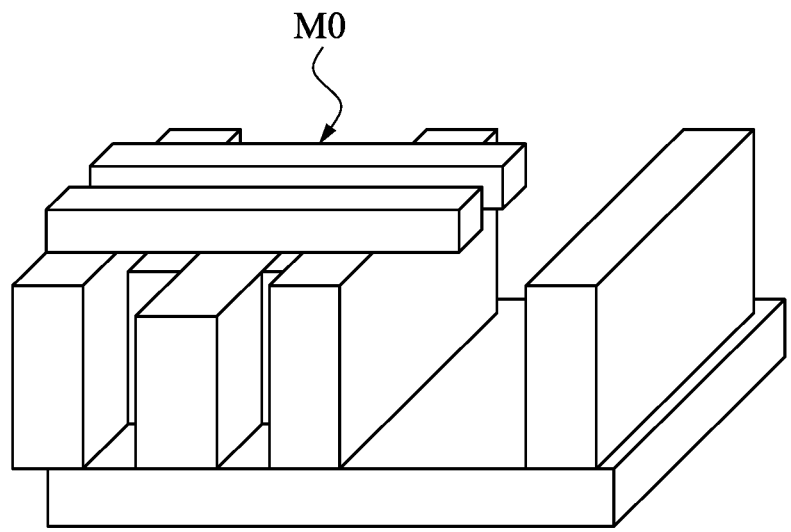
Figure 3D:
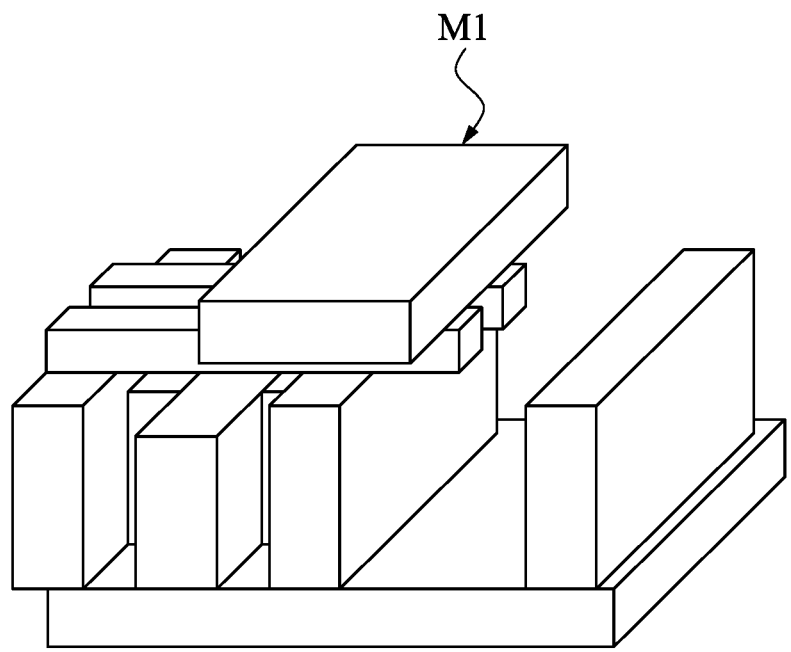
Figure 4:
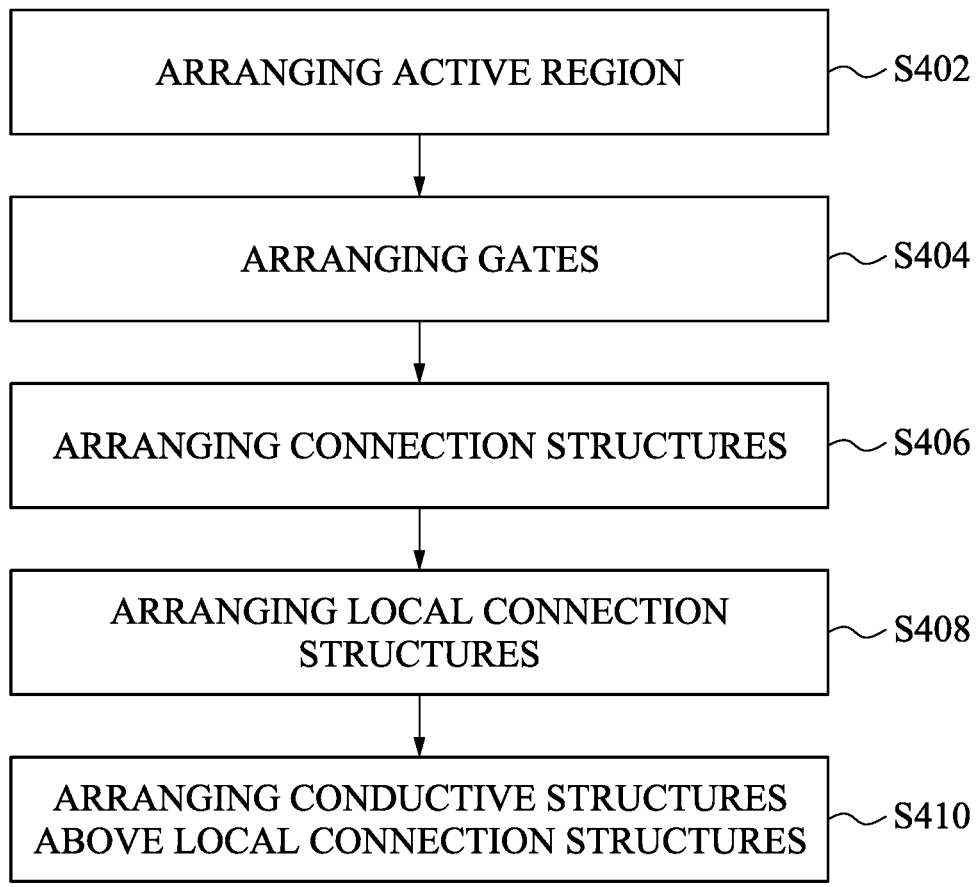
FIG. 4 is a flow chart showing a method 400 associated with the layout structure of FIG. 1, FIGS. 2A-2D and FIGS. 3A-3D, in accordance with various embodiments of the present disclosure.

Reference is made to FIG. 4. FIG. 4 is a flow chart showing a method 400 associated with the layout structure 100 of FIG. 1, FIGS. 2A-2D, and FIGS. 3A-3D, in accordance with various embodiments of the present disclosure. The method 400 is associated with forming the layout structure 100 or performing layout operations to construct the layout structure 100. Operations of forming or constructing the layout structure 100 associated with FIGS. 2A-2D and FIGS. 3A-3D are described by method 400 in FIG. 4. The operations of method 400 described herein are given for explanation purposes. Various operations associated with other layout structures are within the contemplated scope of the present disclosure.

In operation S402, with reference to FIG. 1, and FIG. 2A, the active region OD is arranged. In some embodiments, the active region OD defines the approximate area of the bit cells and the strap cells. Therefore, alternatively stated, in operation S402, the active region OD is arranged to form the bit cells and the strap cells for the layout structure 100 as illustrated in FIG. 1.

For illustration of FIG. 3A with reference to FIG. 2A, to form FinFETs, the active region OD is processed to form fin structures, so that the first gate 106 and the second gate 108 of the strap cell cross the fin structures, and the second gate 108 of the strap cell is arranged at one end of the fin structures.

In operation S404, with reference to FIG. 2A and FIG. 3A, the first gate 106 of the strap cells is arranged across the active region OD, the second gate 108 of the strap cells is arranged next to the first gate 106 of the strap cells and at the end of the active region OD, and the third gate 110 of the logic cells is arranged next to the second gate 108 of the strap cells in the layout structure 100. For illustration of FIG. 2A and FIG. 3A, the first gate 106 of the strap cells and the second gate 108 of the strap cells traverse the active region OD. The first gate 106 of the strap cells, the second gate 108 of the strap cells, and the third gate 110 of the logic cells are disposed in parallel with each other and spaced apart evenly. The distance between each pair of adjacent gates is defined as the gate pitch. Based on the operation S402, operation S404, FIG. 1, FIG. 2A, and FIG. 3A, the strap cells are disposed between the bit cells and the logic cells.

The present disclosure is not limited to the sequence of operations of arranging the active region OD and arranging the gates in the method 400. The sequence of the operation in method 400 herein is given for explanation purposes. Various sequences of operation in method 400 are within the contemplated scope of the present disclosure. For example, in some embodiments, the first gate 106 and the second gate 108 of the strap cells are arranged before the active region OD is arranged. In some other embodiments, the active region OD is arranged before the first gate 106 and the second gate 108 of the strap cells are arranged.

In operation S406, with reference to FIG. 1, FIG. 2B and FIG. 3B, the connection structure MD is arranged. The connection structure MD is disposed between the first gate 106 and the second gate 108 of the strap cells and traversing the active region OD. For illustration of FIG. 2B and FIG. 3B, the connection structure MD is evenly spaced apart from the first gate 106 and the second gate 108 in the strap cells. Alternatively stated, the distance between the first gate 106 and the connection structure MD is equal to the distance between the second gate 108 and the connection structure MD. However, the distance between the first gate 106 and the connection structure MD and the distance between the second gate 108 and the connection structure MD illustrated in the FIG. 2B and FIG. 3B are given for illustrative purposes. Various distances between the first gate 106 and the connection structure MD and various distances between the second gate 108 and the connection structure MD are within the contemplated scope of the present disclosure. For example, in various embodiments, the connection structure MD is arranged closer to the first gate 106 in the strap cells. For another example, in various embodiments, the connection structure MD is arranged closer to the second gate 108 in the strap cells.

Figure 2C:
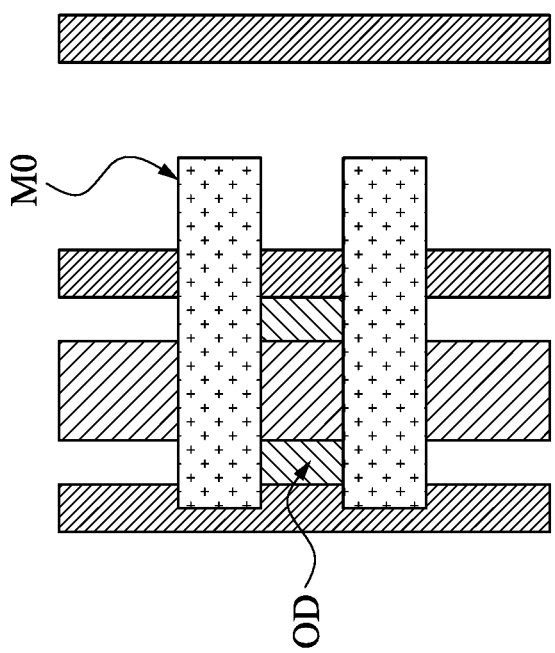

In operation S408, with reference to FIG. 2C and FIG. 3C, the local connection structures M0 are arranged across the first gate 106 and the second gate 108 of the strap cells. For illustration of FIG. 2C and FIG. 3C, the local connection structures M0 are continuous structures and extended to the bit cells (not shown in FIG. 2C and FIG. 3C). Therefore, the local connection structures M0 shown in FIG. 2A and FIG. 3A are also referred as to local connection structure segments which indicate the segments of the local connection structures M0 located overlapped with the strap cells. For illustration of FIG. 2C and FIG. 3C, the local connection structures M0 cross the first gate 106 and the second gate 108. In some other embodiments, the local connection structures M0 cross more gates, in addition to the first gate 106 and the second gate 108 of the strap cells. For illustration, the local connection structures M0 cross the first gate 106, the second gate 108, and one more dummy gate as shown in FIG. 5 which is discussed below.

The local connection structures M0 in FIG. 2C and FIG. 3C have a length which indicates the width of the strap cells. In some embodiments, the length of the local connection structures M0 is equal to 1.5 times of the gate pitch. In some other embodiments, the length of the local connection structures M0 is longer than 1.5 times of the gate pitch and shorter than 2 times of the gate pitch. Alternatively stated, the location of the end of the local connection structures M0 is adjustable and arranged from the center of the second gate 108 and the third gate 110 to the third gate, but the local connection structures M0 are separated from the third gate 110 of the logic cells.

In some approaches, the local connection structures M0 discussed above are arranged across the first gate 106, the second gate 108, and a number (e.g., more than three) of dummy gates of the strap cells, in which the dummy gates are configured to support the local connection structures M0 to prevent deformation. The dummy gates are electrical non-functional structures, and the dummy gates have the identical physical properties as the first gate 106 and the second gate 108 of the strap cells. The dummy gates are spaced the gate pitch apart from the adjacent second gate 108 or the adjacent dummy gate. For illustration, the length of the local connection structures M0 is at most 5 times of the gate pitch.

Compared to the aforementioned approaches, the local connection structures M0 are shorter, for example, 2.5, 3.5, 4.5, or 2.5-4.5 times of the gate pitch. The shortened local connection structures M0 are provided in the present disclosure to reduce the layout area in the layout structure. Alternatively stated, the layout structure of the present disclosure reduces the dummy gates in order to save the space in the layout structure. Furthermore, the shorter local connection structures M0 effectively contribute less RC (resistor-capacitor) constant to the memory device, such that the operation speed of the memory device is higher, compared to the aforementioned approaches. In some embodiments, reducing the length of the local connection structures M0 which are configured as bit lines in some embodiments shortens the bit lines to enhance the performance of the memory device.

In operation S410, with reference to FIG. 2D and FIG. 3D, the conductive structure M1 is arranged above the local connection structures M0, the active region OD, and the second gate 108 of the strap cell. For illustration of FIG. 2D and FIG. 3D, the conductive structure M1 is coupled to the local connection structures M0. Alternatively stated, each local connection structure M0 is disposed separately, but the local connection structures M0 are coupled together by the conductive structure M1.

In some embodiments, the above operations are performed by one or more processors. The above illustrations include exemplary operations, but the operations are not necessarily performed in the order shown. Operations may be added, replaced, changed order, and/or eliminated as appropriate, in accordance with the spirit and scope of various embodiments of the present disclosure.

Figure 5A:
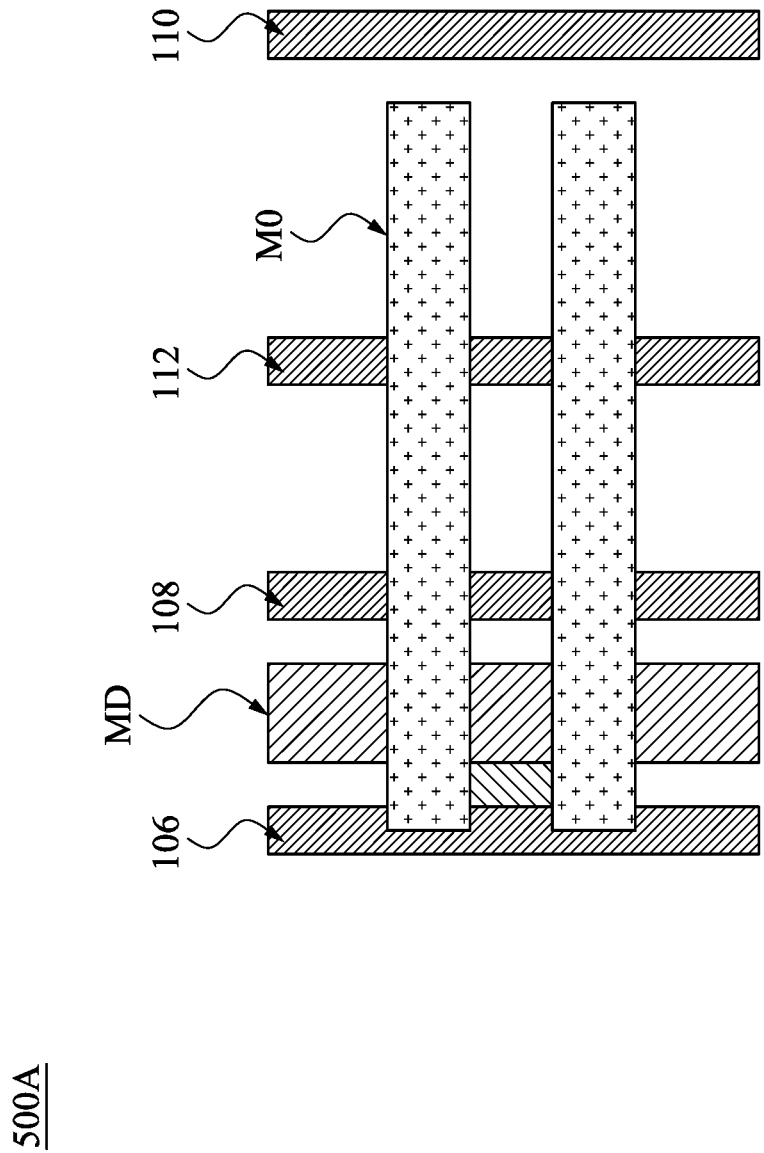
FIGS. 5A-5B are schematic diagrams of layout structures associated with the layout structure of FIG. 1, in accordance with other embodiments of the present disclosure.
Figure 5B:
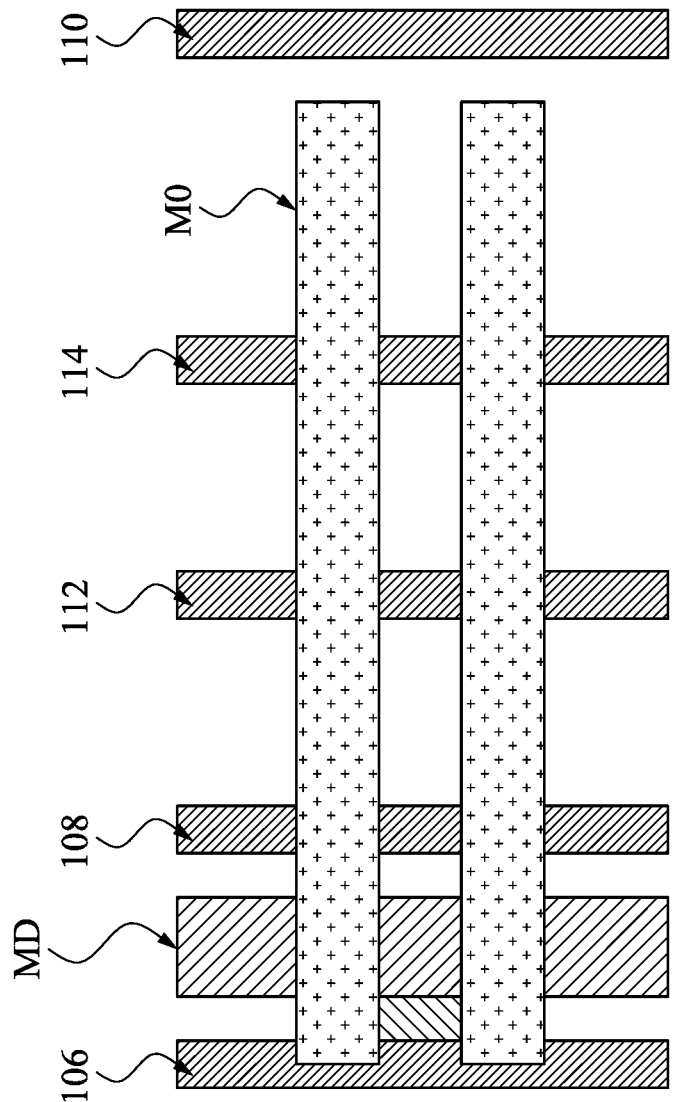

Reference is made to FIGS. 5A-5B. FIGS. 5A-5B are each a schematic diagram of the layout structures 500A-500B associated with the layout structure 100 in FIG. 1, in accordance with alternative embodiments of the present disclosure. With respect to the embodiments of FIG. 1, like elements in FIGS. 5A-5B are designated with the same reference for ease of understanding, and some elements in FIG. 1 are omitted in FIGS. 5A-5B for simplicity of illustration (for example, the bit cells are not shown in FIGS. 5A-5B).

In some embodiments, the layout structure 500A includes the bit cells (not shown in FIG. 5A), the strap cells, and the logic cells. The bit cells and the logic cells are similar to the bit cells and the logic cells in FIG. 1. Compared to the strap cells in FIG. 1, the strap cells in layout structure 500A in FIG. 5A further includes a fourth gate 112. For illustration of FIG. 5A, the fourth gate 112 is disposed immediately between the second gate 108 and the third gate 110. The fourth gate 112 is spaced the gate pitch apart from the second gate 108 and is also spaced the gate pitch apart from the third gate 110. In such embodiments, the distance between the second gate 108 and the third gate 110 is 2 times of the gate pitch. Alternatively stated, the space between the second gate 108 and the third gate 110 is evenly divided by the fourth gate 112. The local connection structures M0 are disposed above the first gate 106, the second gate 108, and the fourth gate 112. The local connection structures M0 are separated from the third gate 112. In some embodiments, the length of the local connection structures M0 is 2.5 of times the gate pitch. In some embodiments, the length of the local connection structures M0 is approximate 143 nm. In other embodiments, the length of the local connection structures M0 is longer than 2 times of the gate pitch and shorter than 3 times of the gate pitch. In alternatively embodiments, the length of the local connection structures M0 is ranged from about 115 nm to about 173 nm when the gate pitch is about 57.5 nm.

In some embodiments, the layout structure 500B includes the bit cells (not shown in FIG. 5B), the strap cells, and the logic cells. The bit cells and the logic cells are similar to the bit cells and the logic cells in FIG. 1. Compared to the strap cells in FIG. 1, the strap cells in layout structure 500B in FIG. 5B further includes a fourth gate 112 and a fifth gate 114. For illustration of FIG. 5B, the fourth gate 112 is disposed between the second gate 108 and the third gate 110, and the fourth gate 112 is disposed next to the second gate 108. The fifth gate 114 is disposed between the fourth gate 112 and the third gate 110. The local connection structures M0 are disposed above the first gate 106, the second gate 108, the fourth gate 112, and the fifth gate 114. The local connection structures M0 are separated from the third gate 110. In some embodiments, there is no other gate structures disposed between the second gate 108 and the fourth gate 112, or disposed between the fourth gate 112 and the fifth gate 114. The fourth gate 112 is space the gate pitch apart from the second gate 108, the fifth gate 114 is spaced the gate pitch apart from the fourth gate 112, and the third gate 110 is spaced the gate pitch apart from the fifth gate 114. Alternatively stated, the space between the second gate 108 and the third gate 110 is evenly divided into three sections by the fourth gate 112 and the fifth gate 114. Therefore, the distance between the second gate 108 and the third gate 110 is 3 times of the gate pitch. In some embodiments, the distance between the second gate 108 and the third gate 110 is approximate 230 nm. In some embodiments, the length of the local connection structures M0 is 3.5 times of the gate pitch. In some embodiments, the length of the local connection structures M0 is approximate 201 nm. In other embodiments, the length of the local connection structures M0 is longer than 3 times of the gate pitch and shorter than 4 times of the gate pitch. In alternatively embodiments, the length of the local connection structures M0 is ranged from about 173 nm to about 230 nm.

In alternative embodiments, the strap cells further include a sixth gate (not shown) disposed between the fifth gate 114 and the third gate 110. The local connection structures M0 are disposed above the first gate 106, the second gate 108, the fourth gate 112, the fifth gate 114, and the sixth gate. The local connection structures M0 are separated from the third gate 110. The sixth gate is spaced the gate pitch apart from the fifth gate 114, and the third 110 is spaced the gate pitch apart from the sixth gate. Therefore, the distance between the second gate 108 and the third gate 110 is 4 times of the gate pitch. In some embodiments, the distance between the second gate 108 and the third gate 110 is approximate 289 nm. In some embodiments, the length of the local connection structures M0 is 4.5 times of the gate pitch. In some embodiments, the length of the local connection structures M0 is approximate 258 nm. In some other embodiments, the length of the local connection structures M0 is longer than 4 times of the gate pitch and shorter than 5 times of the gate pitch. In alternatively embodiments, the length of the local connection structures M0 is ranged from about 230 nm to about 289 nm.

In some embodiments, the first gate 106, the second gate 108, the fourth gate 112, the fifth gate 114, or the sixth gate, as discussed above, is a dummy gate. In various embodiments, the first gate 106, the second gate 108, the fourth gate 112, the fifth gate 114, and the sixth gate, as discussed above, are all dummy gates. In some embodiments, the dummy gates are configured to support the local connection structures M0 to prevent deformation, and are electrically non-functional structures.

Based on the embodiments discussed above, the length of the local connection structures M0 is in a range of 1.5-5 times of the gate pitch. In some other embodiments, the length of the local connection structures M0 is in a range of approximately 85 nm and approximately 289 nm.

Figure 6:
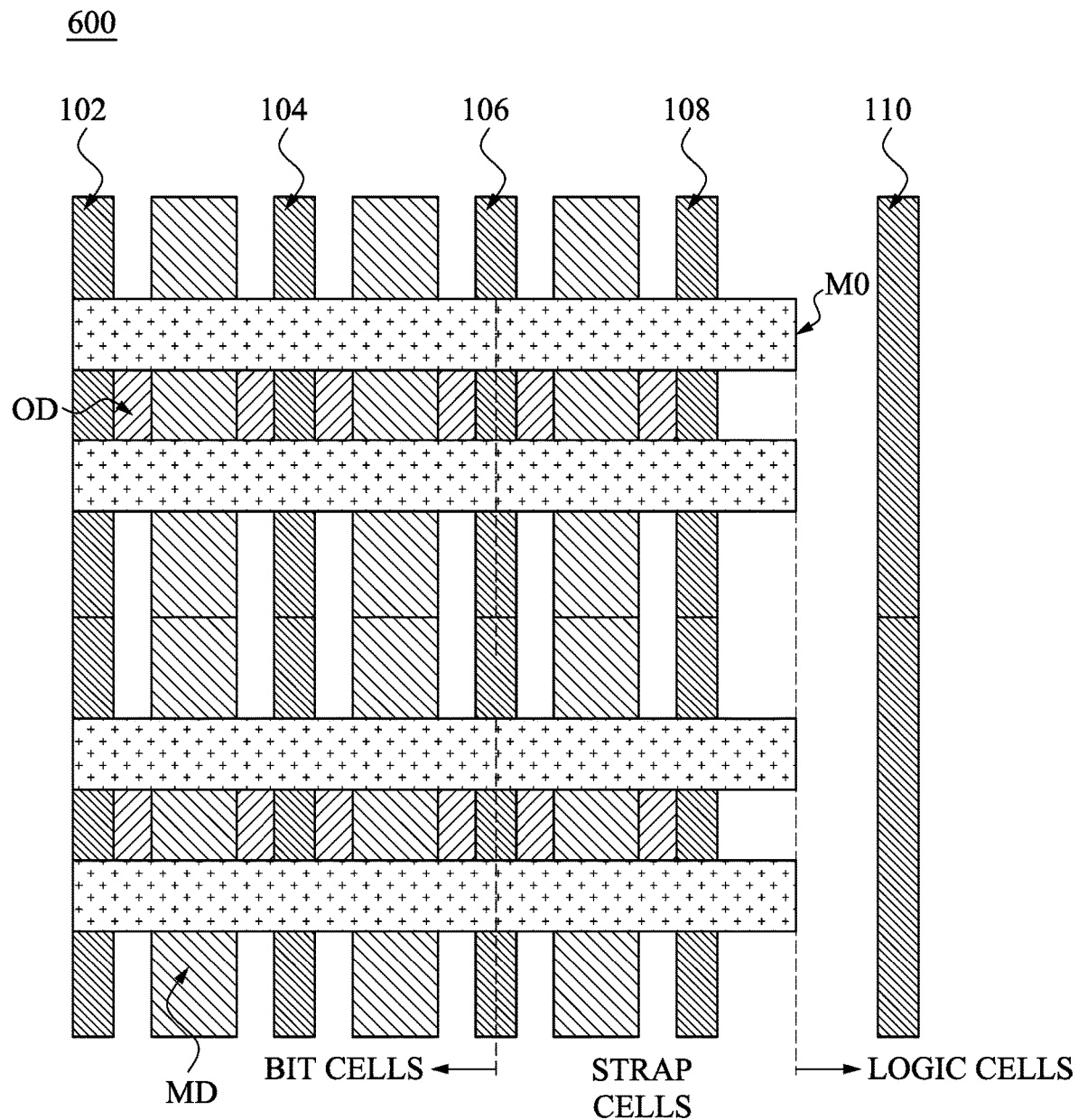
FIG. 6 is a schematic diagram of layout structure associated with the layout structure of FIG. 1, in accordance with alternative embodiments of the present disclosure.

Reference is made to FIG. 6. FIG. 6 is a schematic diagram of layout structure 600 associated with the layout structure 100 of FIG. 1, in accordance with alternative embodiments of the present disclosure. With respect to the embodiments of FIG. 1, like elements in FIG. 6 are designated with the same reference for ease of understanding.

In some embodiments, the layout structure 600 includes a number of bit cells, a number of strap cells, and a number of logic cells. The bit cells and strap cells in layout structure 600, like the bit cells and the strap cell in layout structure 100, include gates, active region OD, connection structures MD, local connection structures M0, and conductive structures M1. The bit cells are arranged in an array. The strap cells are arranged between the array of the bit cells and the logic cells. For illustration of FIG. 6, the bit cells are arranged in several columns disposed in the layout structure 600. The strap cells are arranged in a column immediately next to the right end column of the bit cells in a plane view. The logic cells are arranged in a column next to the column of the strap cells. The local connection structures M0 are disposed cross the bit cells and the strap cells, and are separated from the logic cells. In some embodiments, the strap cells in layout structure 600 include at most three dummy gates (not shown in FIG. 6), and the local connection structures M0 are disposed across the gates 102, 104, 106, 108 and the at most three dummy gates. Therefore, the length of the local connection structures M0 is in a range of 1.5-5 times of the gate pitch.

In some embodiments, a semiconductor device includes at least one memory cell, at least one strap cell, at least one conductive segment, and at least one logic cell. The at least one strap cell is arranged abutting the at least one memory cell. The at least one strap cell includes an active region, a first gate, and a second gate. The first gate is arranged across the active region. The second gate is arranged across the active region and disposed at the end of active region. The at least one conductive segment is disposed over the first gate and the second gate. The at least one strap cell is disposed between the at least one memory cell and the at least one logic cell, and the at least one logic cell includes a third gate. The at least one conductive segment is spaced apart from the third gate, and the length of the at least one conductive segment is smaller than 5 times of a gate pitch between the first gate and the second gate.

In some embodiments, the third gate is disposed next to the second gate without the gate disposed between.

In some embodiments, the length of the at least one conductive segment is approximately 1.5 times the gate pitch.

In some embodiments, the at least one strap cell includes a fourth gate disposed between the second gate and the third gate. The at least one conductive segment is disposed over the first gate, the second gate, and the fourth gate.

In some embodiments, the at least one strap cell includes a fourth gate and a fifth gate. The fourth gate disposed between the second gate and the third gate and disposed next to the second gate. The fifth gate disposed between the fourth gate and the third gate. The at least one conductive segment is disposed over the first gate, the second gate, the fourth gate, and the fifth gate.

In some embodiments, the length of the at least one conductive segment is in a range of approximately 0.085 micrometers and approximately 0.289 micrometers.

In some embodiments, the length of the at least one conductive segment is equal to the width of the at least one strap cell.

Another exemplary memory device includes a strap cell disposed between a memory cell and a logic cell. The strap cell includes an active region, a plurality of gates, and at least one conductive segment. The plurality of gates include a first gate, a second gate, and at most three dummy gates. The first gate and the second gate are arranged across the active region. The second gate is disposed at the end of the active region and is disposed next to the first gate. The dummy gates are not arranged across the active region. The at least one conductive segment is disposed over the first gate, the second gate, and at most two of the dummy gates.

In some embodiments, the gates include no dummy gate, and the at least one conductive segment is arranged across the first gate, the second gate, and no dummy gate.

In some embodiments, the length of the at least one conductive segment is approximately 0.085 micrometers.

In some embodiments, the gates include a first dummy gate that is disposed next to the second gate. The at least one conductive segment is arranged across the first gate, the second gate, and the first dummy gate.

In some embodiments, the gates include a first dummy gate that is disposed next to the second gate, and a second dummy gate that is disposed next to the first dummy gate. The at least one conductive segment is arranged across the first gate, the second gate, the first dummy gate, and the second dummy gate.

In some embodiments, the length of the at least one conductive segment is in a range of approximately 0.085 micrometers and approximately 0.289 micrometers, and the gate pitch between the first gate and the second gate is approximately 0.0575 micrometers.

In some embodiments, the length of the at least one conductive segment is in a range between the first length and the second length. The at least one conductive segment has the first length when the at least one conductive segment is arranged across no dummy gate, and the at least one conductive segment has the second length when the at least one conductive segment is arranged across two of the dummy gates.

In some embodiments, the length of the at least one conductive segment is smaller than 4 times the gate pitch between the first gate and the second gate.

In some embodiments, the length of the at least one conductive segment is equal to the width of the strap cell.

Another exemplary method includes arranging a first gate, arranging a second gate, and arranging the at least one conductive segment in a strap cell disposed between a memory cell and a logic cell. The first gate is arranged across an active region. The second gate is arranged next to the first gate and at the end of the active region. When the at least one conductive segment has the first length, the at least one conductive segment is arranged across the first gate, the second gate, and no dummy gate in the strap cell.

In some embodiments, when the at least one conductive segment has the second length, the at least one conductive segment is arranged across the first gate, the second gate, and only one dummy gate in the strap cell.

In some embodiments, when the at least one conductive segment has a third length, the at least one conductive segment is arranged across the first gate, the second gate, and at most two dummy gates in the strap cell.

In some embodiments, the length of the at least one conductive segment is smaller than 4 times the gate pitch between the first gate and the second gate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    at least one memory cell;
    at least one strap cell abutting the at least one memory cell, the at least one strap cell comprising:
        an active region;
        a first gate arranged across the active region;
        a second gate arranged across the active region and disposed at an end of the active region; and
        at least one conductive segment disposed over the first gate and the second gate; and
    at least one logic cell, wherein the at least one strap cell is disposed between the at least one memory cell and the at least one logic cell, and the at least one logic cell comprises a third gate;
    wherein the at least one conductive segment of the at least one strap cell is spaced apart from the third gate of the at least one logic cell, and a length of the at least one conductive segment of the at least one strap cell is smaller than five times of a gate pitch between the first gate and the second gate of the at least one strap cell.

2. The semiconductor device of claim 1, wherein the third gate is disposed next to the second gate without a gate therebetween.

3. The semiconductor device of claim 2, wherein the length of the at least one conductive segment is approximately 1.5 times the gate pitch.

4. The semiconductor device of claim 1, wherein the at least one strap cell further comprises:
    a fourth gate disposed between the second gate and the third gate;
    wherein the at least one conductive segment is disposed over the first gate, the second gate, and the fourth gate.

5. The semiconductor device of claim 1, wherein the at least one strap cell further comprises:
    a fourth gate disposed between the second gate and the third gate and disposed next to the second gate; and
    a fifth gate disposed between the fourth gate and the third gate;
    wherein the at least one conductive segment is disposed over the first gate, the second gate, the fourth gate, and the fifth gate.

6. The semiconductor device of claim 1, wherein the length of the at least one conductive segment is in a range of approximately 0.085 micrometers and approximately 0.289 micrometers.

7. The semiconductor device of claim 1, wherein the length of the at least one conductive segment is equal to a width of the at least one strap cell.

8. A semiconductor device, comprising:
    a strap cell disposed between a memory cell and a logic cell, the strap cell comprising:
        an active region;
        a plurality of gates comprising a first gate, a second gate, and at most three dummy gates, wherein the first gate and the second gate are arranged across the active region, and the second gate is disposed at an end of the active region and is disposed next to the first gate, and the dummy gates are not arranged across the active region; and
        at least one conductive segment disposed over the first gate, the second gate, and at most two of the dummy gates,
        wherein the second gate and the at most three dummy gates of the strap cell are spaced apart from each other evenly.

9. The semiconductor device of claim 8, wherein the plurality of gates comprise no dummy gate, and the at least one conductive segment is arranged across the first gate, the second gate, and no dummy gate.

10. The semiconductor device of claim 9, wherein a length of the at least one conductive segment is approximately 0.085 micrometers.

11. The semiconductor device of claim 8, wherein the plurality of gates comprise a first dummy gate that is disposed next to the second gate, and the at least one conductive segment is arranged across the first gate, the second gate, and the first dummy gate.

12. The semiconductor device of claim 8, wherein the plurality of gates comprise a first dummy gate that is disposed next to the second gate, and a second dummy gate that is disposed next to the first dummy gate, and the at least one conductive segment is arranged across the first gate, the second gate, the first dummy gate, and the second dummy gate.

13. The semiconductor device of claim 8, wherein a length of the at least one conductive segment is in a range of approximately 0.085 micrometers and approximately 0.289 micrometers, and a gate pitch between the first gate and the second gate is approximately 0.0575 micrometers.

14. The semiconductor device of claim 8, wherein a length of the at least one conductive segment is in a range between a first length and a second length, wherein the at least one conductive segment has the first length when the at least one conductive segment is arranged across no dummy gate, and the at least one conductive segment has the second length when the at least one conductive segment is arranged across two of the dummy gates.

15. The semiconductor device of claim 8, wherein a length of the at least one conductive segment is smaller than four times a gate pitch between the first gate and the second gate.

16. The semiconductor device of claim 8, wherein a length of the at least one conductive segment is equal to a width of the strap cell.

17. A semiconductor device, comprising:

a logic cell comprising a gate; and a strap cell disposed separated from the logic cell and abutting a memory cell, the strap cell comprising:

an active area;

a first gate arranged across the active area;

a second gate arranged across the active area and disposed at an end of the active area; and a conductive segment disposed over the first gate and the second gate and disposed apart from the gate of the logic cell, wherein the first gate and the second gate of the strap cell and the gate of the logic cell are arranged in parallel with each other and spaced apart from each other evenly.

18. The semiconductor device of claim 17, wherein the strap cell further comprises:

a dummy gate disposed next to the second gate, wherein the dummy gate is not arranged across the active area, and the conductive segment is disposed over the dummy gate.

19. The semiconductor device of claim 17, wherein the strap cell further comprises:

a first dummy gate and a second dummy gate disposed between the second gate and the gate of the logic cell, wherein the conductive segment is disposed across the first dummy gate and the second dummy gate, and a gate pitch between the second gate and the first dummy gate is equal to a gate pitch between the first dummy gate and the second dummy gate.

20. The semiconductor device of claim 17, wherein the strap cell further comprises:

at most three dummy gates disposed between the second gate and the gate of the logic cell, wherein the conductive segment is disposed over at most two of the dummy gates.

* * * * *